(12) United States Patent
Yang et al.

(10) Patent No.: US 8,587,985 B2
(45) Date of Patent: Nov. 19, 2013

(54) MEMORY ARRAY WITH GRADED RESISTANCE LINES

(75) Inventors: Jianhua Yang, Palo Alto, CA (US); John Paul Strachan, Millbrae, CA (US); Wei Wu, Palo Alto, CA (US); Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 420 days.

(21) Appl. No.: 12/896,641

(22) Filed: Oct. 1, 2010

(65) Prior Publication Data

US 2012/0081945 A1    Apr. 5, 2012

(51) Int. Cl.
*G11C 11/00*    (2006.01)

(52) U.S. Cl.
USPC ..... 365/148; 365/132; 438/128; 257/E21.602

(58) Field of Classification Search
USPC ............ 365/148, 132; 438/128; 257/E21.602
See application file for complete search history.

(56) References Cited

U.S. PATENT DOCUMENTS

| | | | |
|---|---|---|---|
| 8,416,609 B2* | 4/2013 | Meade .......................... | 365/149 |
| 2009/0080229 A1* | 3/2009 | Chandra Sekar et al. ....... | 365/63 |
| 2011/0292712 A1* | 12/2011 | Perner ........................... | 365/148 |
| 2012/0030434 A1* | 2/2012 | Nickel et al. ................... | 711/154 |
| 2012/0032345 A1* | 2/2012 | Strukov et al. ................. | 257/774 |

\* cited by examiner

*Primary Examiner* — Toan Le

(57) ABSTRACT

A memory array with graded resistance lines includes a first set of lines intersecting a second set of lines. A line from one of the sets of lines includes a graded resistance along a length of the line.

18 Claims, 7 Drawing Sheets

MEMORY ARRAY WITH GRADED RESISTANCE LINES

STATEMENT OF GOVERNMENT INTEREST

This invention has been made with government support. The government has certain rights in the invention.

BACKGROUND

As the use of digital data increases, the demand for faster, smaller, and more efficient memory structures increases. One type of memory structure that has recently been developed is a crossbar memory array. A crossbar array includes a first set of lines which intersect a second set of parallel lines. Programmable memory elements configured to store digital data are placed at intersections between the first set of lines and second set of lines. A crossbar array can be used for a variety of electronic circuit applications such as a memory array.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
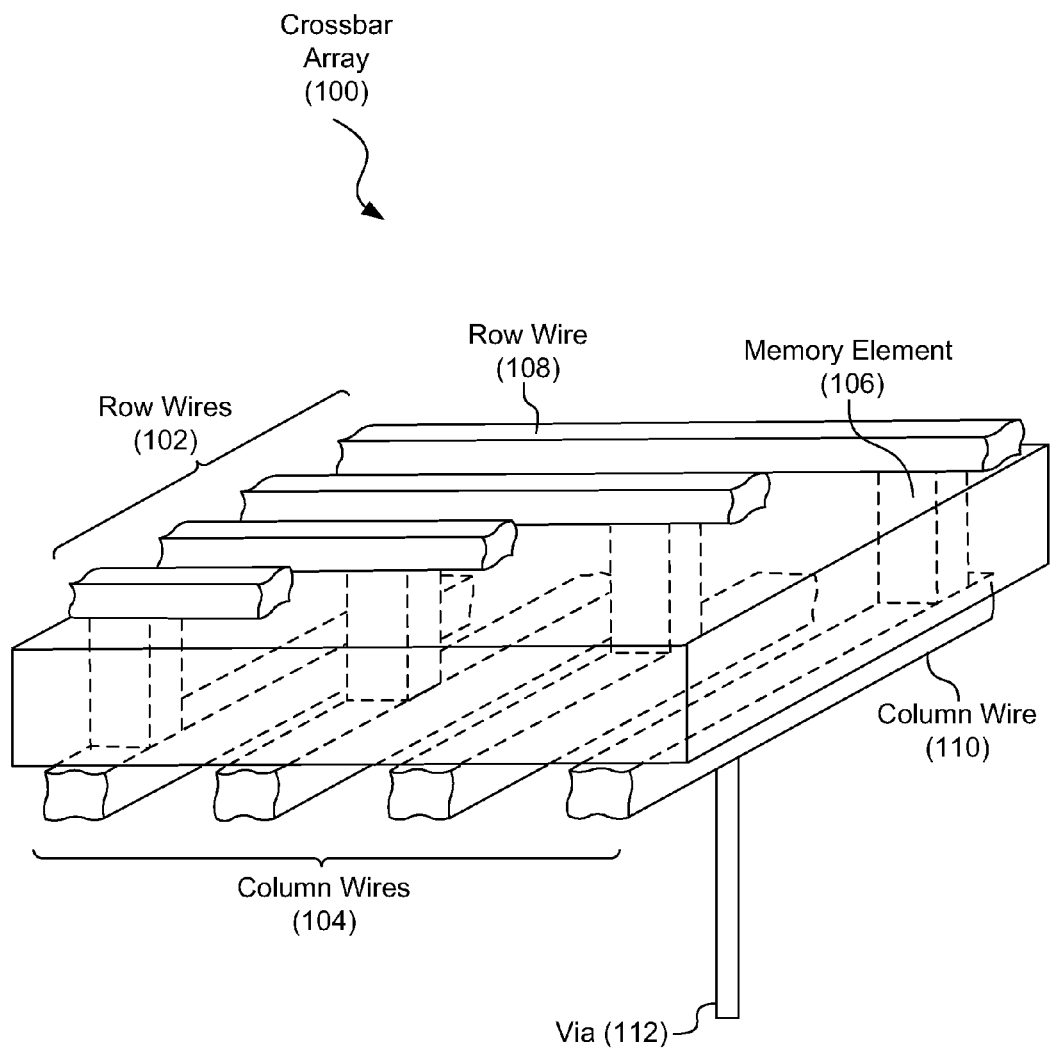
FIG. 1 is a diagram showing an illustrative crossbar memory array, according to one example of principles described herein.

As mentioned above, the process of accessing a memory element within a crossbar array involves the application of a voltage to the memory element. This creates a voltage drop across the memory element. The voltage supplied by a voltage supply will be divided across the resistance of the memory element and the resistance of the lines connecting the voltage supply to the memory element.

As used herein, a "line" will refer to any path for applying a voltage to a memory element. Examples of such a line will include wires, conductive traces and the like.

The resistance of the lines is dependent upon a number of variables including the material, cross-sectional dimensions and length of the lines. If the line is uniform along its length, length will be the variable that determines resistance.

Therefore, because each memory element is located at a different length along the line from where the voltage is applied, the voltage will be divided between the lines and the memory element differently for each memory element. Thus, each memory element will experience a slightly different voltage drop. This discrepancy can cause performance issues during operation of the memory array.

In light of this and other issues, the present specification discloses a system and method for reducing the discrepancy in the voltage dropped across different memory elements within a crossbar memory array. This reduction in the discrepancy in voltage drop across different memory elements is realized by grading the resistance of the lines connected to each memory element.

As used herein and in the appended claims, the term "graded resistance line" will refer to a line with one or more physical characteristics that vary along its length so as to provide a gradient or graded resistance along the length of the line that is in addition to the natural increase in resistance that occurs in a uniform line over its length alone.

According to certain illustrative examples, a crossbar array has lines with graded resistance. The graded resistance can be achieved, for example, by adjusting the width of the lines, the thickness of the lines, or the composition of the lines. The portion of a graded resistance line that has the highest resistance is connected to the circuitry that will be applying a voltage to memory elements along that line. The graded resistance line is configured such that the resistance of the line decreases along a direction away from where the voltage supply is connected to the memory array. As will be described in more detail below, this reduces the discrepancy in voltage dropped across memory elements closer to where the voltage is applied and memory elements farther away from where the voltage is applied.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Referring now to the figures, FIG. 1 is a diagram showing an illustrative crossbar memory array (100). According to certain illustrative examples, the crossbar array (100) includes a set of row lines (102) which are generally in parallel. Additionally, a set of column lines (104) is generally perpendicular to, and intersects, the row lines (102). Programmable memory elements (106) are disposed at the intersections between a row line (108) and a column line (110).

According to certain illustrative examples, the programmable memory elements (106) may be memristive devices. Memristive devices exhibit a "memory" of past electrical stimuli. For example, a memristive device may include a memristive matrix material that contains mobile dopants. These dopants can be moved within a matrix to dynamically alter the electrical operation of the memristive device.

The motion of dopants can be induced by the application of a programming condition such as an applied electrical voltage across a suitable matrix. The programming voltage generates a relatively high electric field through the memristive matrix and alters the distribution of dopants. After removal of the electric field, the location and characteristics of the dopants remain stable until the application of another programming electric field. For example, by changing the dopant configurations within a memristive matrix the electrical resistance of the device may be altered. The memristive device is read by applying a lower reading voltage which allows the internal electrical resistance of the memristive device to be sensed but does not generate a high enough electric field to cause significant dopant motion. Consequently, the state of the memristive device may remain stable over long time periods and through multiple read cycles.

According to certain illustrative examples, the crossbar array (100) may be used to form a non-volatile memory array. Each of the programmable memory elements (106) is used to represent one or more bits of data. Although individual row lines (108) and column lines (110) in FIG. 1 are shown with rectangular cross sections, crossbars may also have square, circular, elliptical, or more complex cross sections. The lines may also have many different widths, diameters, aspect ratios and/or eccentricities. The crossbars may be nanolines, sub-microscale lines, microscale lines, or lines with larger dimensions.

In some cases, the memory elements may be connected to the row lines (102) or column lines through vias between the electrodes of the memory elements. These vias may pass through an interlayer dielectric material positioned between the memory elements and the lines. A dielectric material inhibits the flow of electric current.

According to certain illustrative examples, the crossbar architecture (100) may be integrated into a Complimentary Metal-Oxide-Semiconductor (CMOS) circuit or other conventional computer circuitry. Each individual bit line may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2:
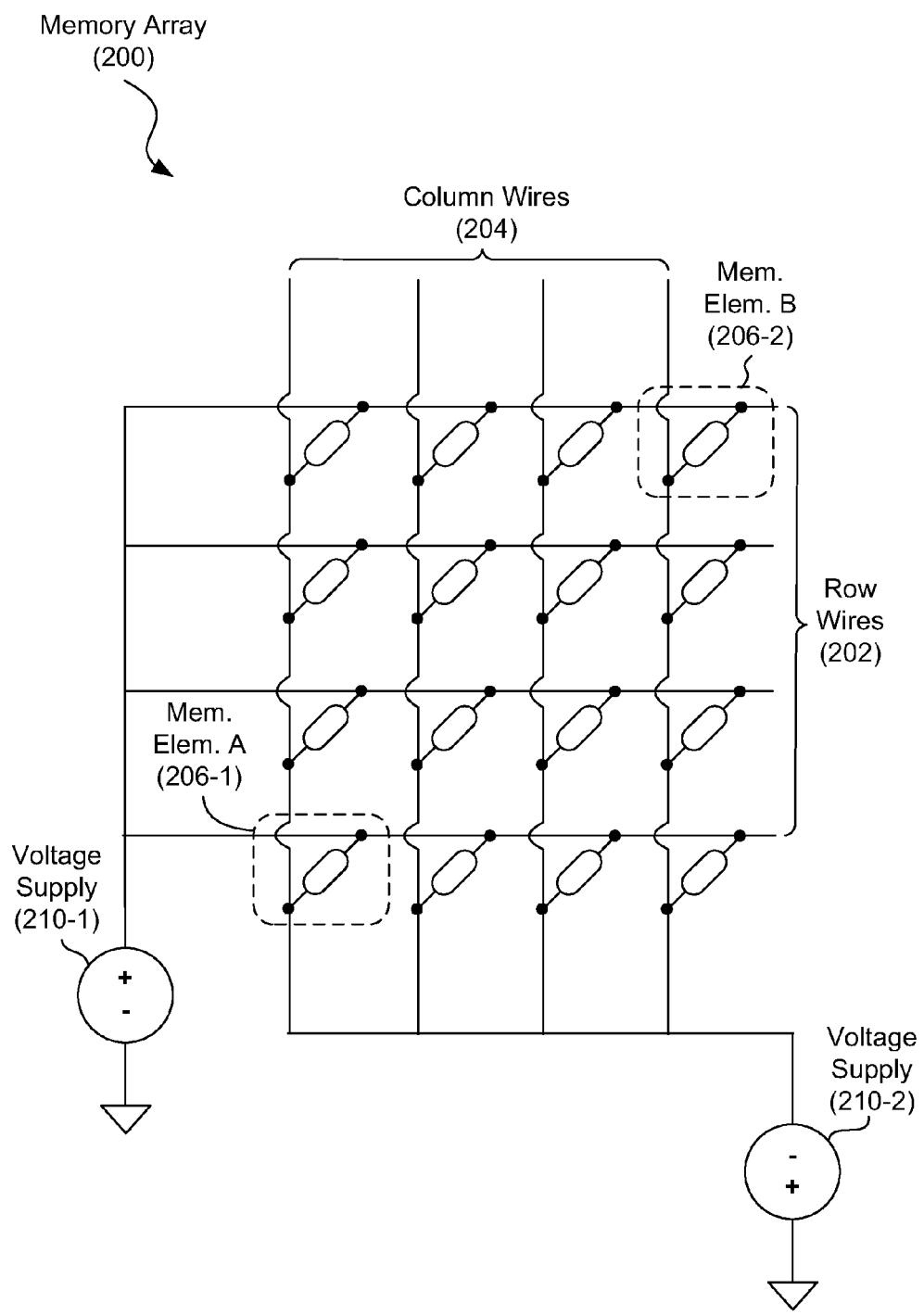
FIG. 2 is a diagram showing an illustrative memory array, according to one example of principles described herein.

FIG. 2 is a schematic diagram showing an illustrative memory array (200). According to certain illustrative examples, the schematic includes a set of row lines (202) intersecting a set of column lines (204). Memory elements (206) are disposed at intersections between the row lines (202) and column lines (204). Voltage supplies (210) are selectively connected to the row lines (202) and the column lines (204). The following will describe an example of how the state of a memory element within a memory array (200) may be set.

To select a target memory element within the memory array (200), a voltage is selectively applied to a row line by a voltage supply (210-1). This row line may be referred to as the selected row line. With the application of the voltage to the row line, each memory element along that line becomes half-selected. To fully select one of the memory elements along the selected row line, a voltage of opposite polarity is applied to the column line connected to the target memory element by a voltage supply (210-2). The total voltage drop across the target memory element will then be a sum of both voltages (210-1, 210-2).

The voltage supply (210) is often a fixed voltage supply. Therefore, the value of the voltage cannot be adjusted. The reason for using a fixed voltage supply is that all of the circuitry within an electronic device is typically designed to operate on a specific voltage. This allows all of the circuitry to draw power from the same source and reduce the need for transformers to convert voltage levels from one level to another level.

As will be described in more detail below, the sum of the voltages (210-1, 210-2) will be divided between the target memory element and the lines running between the memory element and the voltage supply (210). A higher resistance in the lines connecting the voltage supply (210) to the memory elements will cause more of the voltage to be applied across the lines and less across the memory elements (206). The resistance of a line is a function of the length of that line. Consequently, memory elements (206) which are farther away from the voltage supplies (210) will experience a smaller voltage drop than the memory elements (206) that are closer to the voltage supplies. Thus, the voltage applied to memory element A (206-1) will be greater than the voltage applied to memory element B (206-2).

Figure 3:
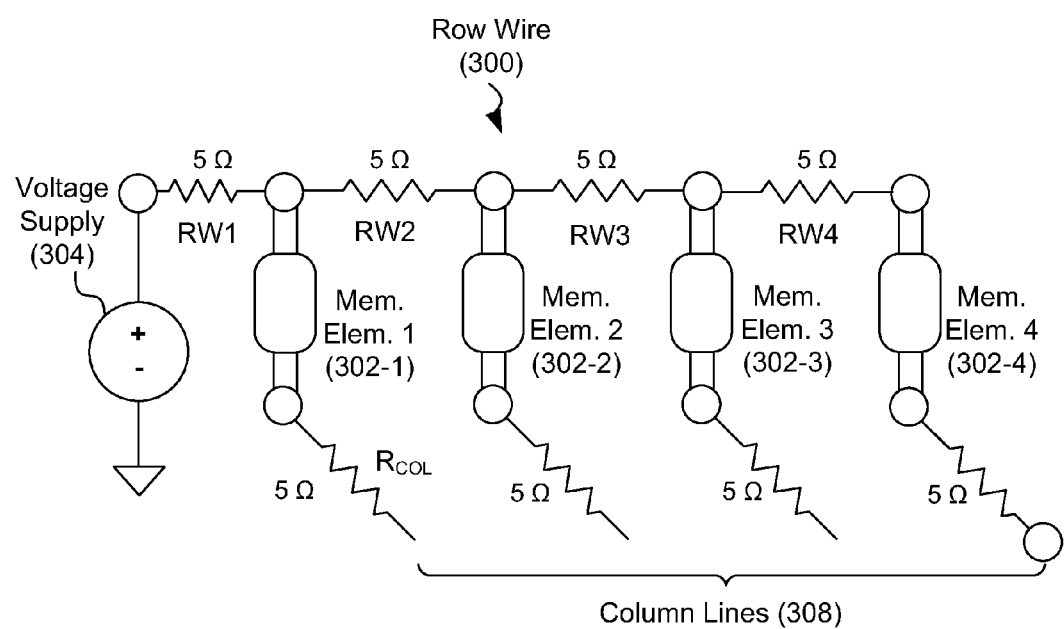
FIG. 3 is a diagram showing an illustrative set of memory elements along a row line, according to one example of principles described herein.

FIG. 3 is a diagram showing an illustrative set of memory elements (302) along a row line (300). According to certain illustrative examples, a voltage supply (304) is connected to the row line (306). This voltage supply (304) supplies a programming voltage to the row line (306). For purposes of illustration, the voltage supply (304) will represent the sum of the voltage applied to the row line and a voltage applied to the column line connected to a target memory element.

In accordance with Kirchhoff's Voltage Law, the voltage across each memory element and the lines connecting to that memory element will be equal. However, that applied voltage will be divided differently between different memory elements (302). The voltage applied by the voltage supply (304) will be divided between the target memory element (302) and the lines connecting to that target memory element (302). A greater resistance of the lines connecting to the target memory element will result in more voltage being dropped across those lines and less across the memory element (302). As mentioned above, the resistance of a line depends in part on the length of that line. Thus, because memory element 4 (302-4) is farther away from the voltage supply (304), more voltage will be dropped across the lines leading to memory element 4 and less voltage will be dropped across memory element 4 (302-4) itself.

The voltage division across memory element 1 (302-1) can be defined by the equation:

$$V_{ME1}=V_{APP}*(R_{ME1}/(R_{W1}+R_{ME1}+R_{COL})) \quad \text{(Equation 1)}$$

Where:
$V_{ME1}$ is the voltage drop across memory element 1 (302-1);
$V_{APP}$ is the voltage supplied by the voltage supply (304);
$R_{ME1}$ is the resistance of the memory element (302-1);
$R_{W1}$ is the resistance of the line segment of the row line between the voltage supply and memory element 1 (302-1); and
$R_{COL}$ is the resistance of the line segment along the column line.

Additionally, the voltage division across memory element 4 (302-4) can be defined by the equation:

$$V_{ME4}=V_{APP}*(R_{ME4}/(R_{W1}+R_{W2}+R_{W3}+R_{W4}+R_{ME4}+R_{COL})) \quad \text{(Equation 2)}$$

Where
$V_{ME4}$ is the voltage drop across memory element 4 (302-4);
$R_{ME4}$ is the resistance of memory element 4 (302-4);

$R_{w2}$ is the resistance of the row line line segment between memory element 1 (302-1) and memory element 2 (302-2);

$R_{w3}$ is the resistance of the row line line segment between memory element 2 (302-2) and memory element 3 (302-3); and $R_{w4}$ is the resistance of the row line line segment between memory element 3 (302-3) and memory element 4 (302-4).

The denominator in equation 2 is greater than the denominator in equation 1. Thus, the voltage drop ($V_{ME4}$) across memory element 4 (302-4) is less than the voltage drop ($V_{ME1}$) across memory element 1 (302-1). In the case that the voltage applied to a memory element is 5 volts, the resistance value of a memory element (302) is 100 ohms, and the resistance of each line segment is 5 ohms, then the voltage drop across memory element 1 would be 4.54 v and the voltage drop across memory element 4 (302-4) would be 4.00 volts. Thus, there is a discrepancy of 0.54 v in the voltage dropped across memory element 1 (302-1) and memory element 4 (302-4). The values used as an example are for illustration purposes and are not necessarily practical values which may be used by a memory array embodying principles described herein.

As mentioned above, this variation in voltage drop across the different memory elements within a memory array can cause performance issues. In light of this issue, the present specification discloses the use of graded resistance lines. These graded resistance lines reduce the discrepancies between the voltage drop across different memory elements within a memory array.

Figure 4:
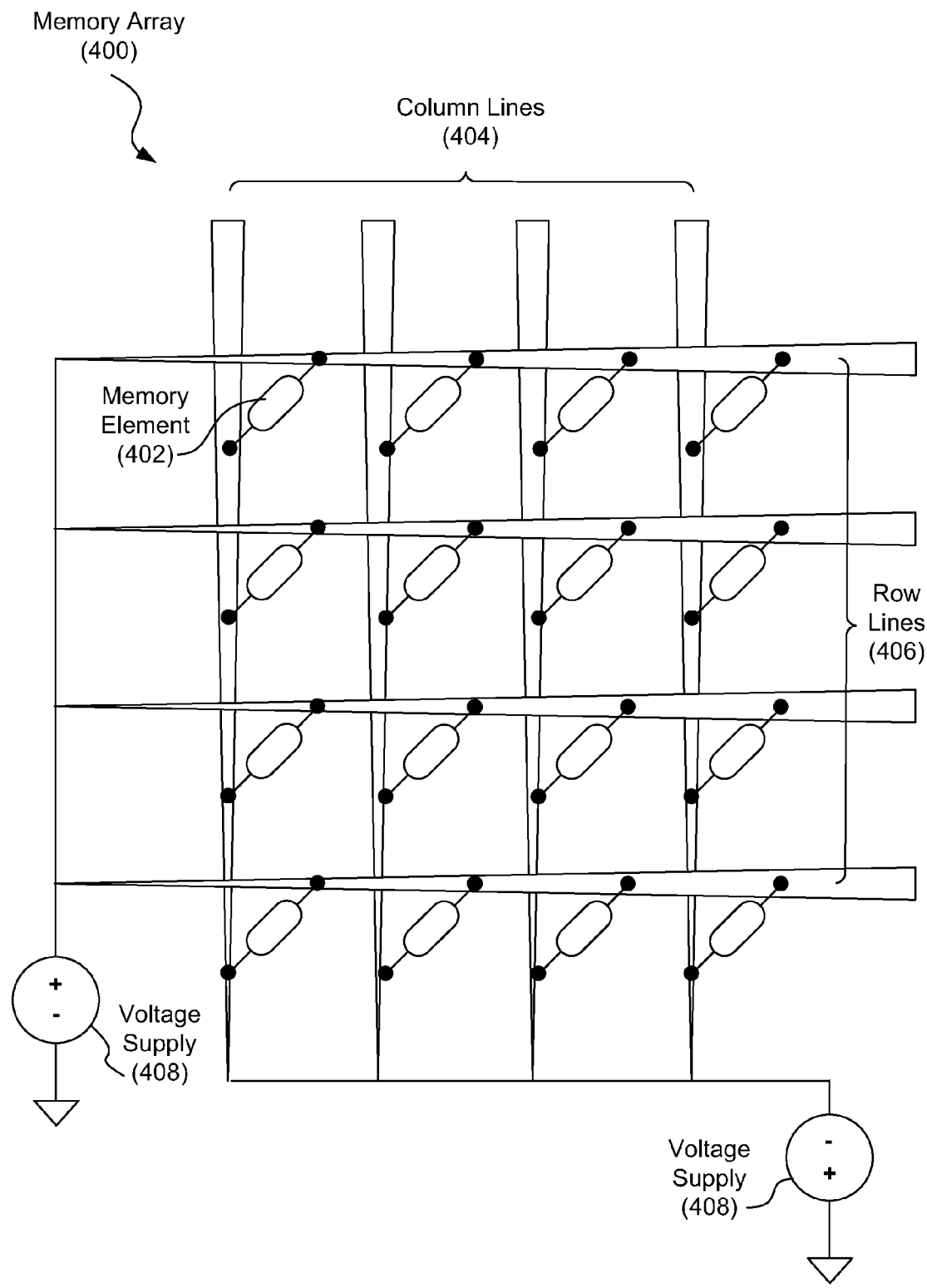
FIG. 4 is a diagram showing an illustrative memory array with graded resistance lines, according to one example of principles described herein.

FIG. 4 is a diagram showing an illustrative memory array with graded resistance lines (404, 406). The memory array includes a set of graded resistance row lines (406) which intersect a set of graded resistance column lines (404). Memory elements (402) are disposed at intersections between the row lines (406) and the column lines (404).

The graded resistance lines (404, 406) are illustrated as having a graded width. A line with a greater cross-sectional area will be less resistive than a line of the same composition but having a smaller cross-sectional area. Thus, the smaller width regions of the illustrated lines (404, 406) have a higher resistance and the greater width regions of the illustrated lines (404, 406) have a lower resistance. The more resistive regions of the lines are closer to the voltage supplies (408). The resistance of the lines gradually decreases along the length of the lines in a direction away from the voltage supplies (408). This effectively reduces the discrepancy in voltage dropped across a memory element (402) between memory elements (402) which are closer to the voltage supplies (408) and memory elements (402) which are farther away from the voltage supplies.

In one example, in order to provide a more compact crossbar array, the graded resistance lines may alter in direction between adjacent lines. A voltage supply is then connected to both sides of the crossbar array. The graded resistance lines going in one direction are then be connected to a first voltage supply while the graded resistance lines going in an opposite direction are then connected to a second voltage supply on the opposite side of the memory array.

Figure 5:
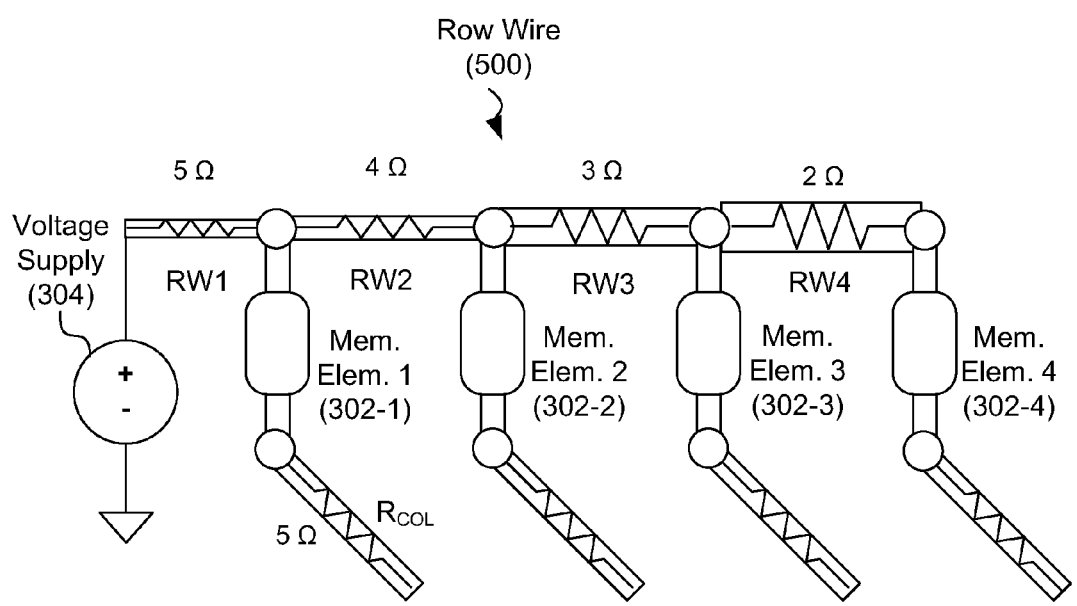
FIG. 5 is a diagram showing an illustrative set of memory elements along a row line with graded resistance, according to one example of principles described herein.

FIG. 5 is a diagram showing an illustrative set of memory elements (302) along a row line (500) with graded resistance. According to certain illustrative examples, the line segments between memory elements become less resistive farther away from the voltage supply (502). In the case that the voltage applied to the row line (306) is 5 volts, the resistance of a memory element is 100 ohms, and the resistance of the line segments are as illustrated, then the voltage drop across memory element 1 would still be 4.54 volts but the voltage drop across memory element 4 (302-4) is now 4.20 volts. Thus, the discrepancy in voltage drop across a memory element close to the voltage supply and farther from the voltage supply is 0.34 volts. This reduced discrepancy in voltage drop increases the performance of the memory array utilizing the graded resistance lines.

Figure 6A:
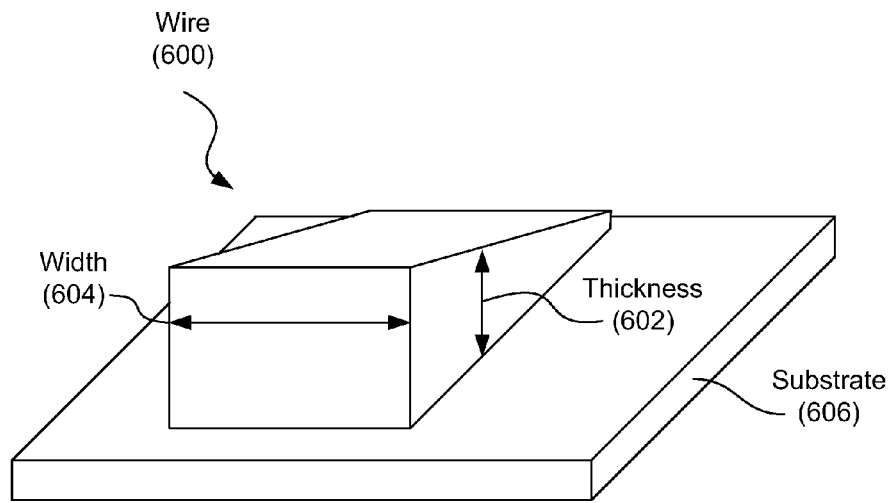
FIG. 6A is a diagram showing an illustrative line having a graded thickness, according to one example of principles described herein.
Figure 6B:
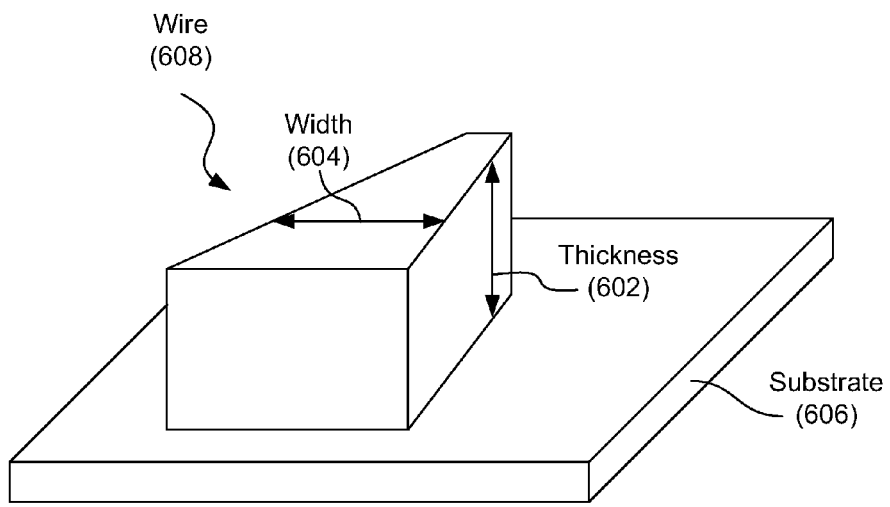
FIG. 6B is a diagram showing an illustrative line having a graded width, according to one example of principles described herein.
Figure 6C:
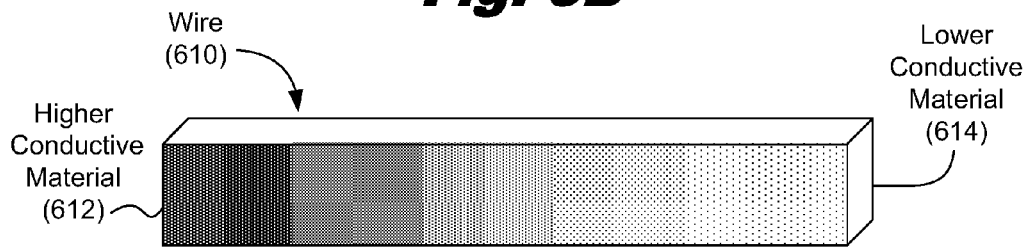
FIG. 6C is a diagram showing an illustrative line having a graded composition, according to one example of principles described herein.

FIGS. 6A-6C illustrate some examples of how a gradation in the resistance of a line may be achieved. FIG. 6A is a diagram showing an illustrative line having a graded thickness (602). Throughout this specification and in the appended claims, the term "thickness" refers to the distance between where the line is deposited onto a substrate (606) and the opposing surface of the line (600). As mentioned above, the resistance of a line is dependent upon the cross-sectional area of the line. Because thickness (602) is one dimension of the cross-sectional area, grading the thickness (602) of a line (600) will grade the resistance of the line (600).

FIG. 6B is a diagram showing an illustrative line having a graded width (604). Throughout this specification and in the appended claims, the term "width" refers to the distance across a line parallel to a substrate (606). As mentioned above, the resistance of a line is dependent upon the cross-sectional area of the line. Because width (604) is one dimension of the cross-sectional area, grading the width (604) of the line will grade the resistance of the line (600).

FIG. 6C is a diagram showing an illustrative line having a graded composition. According to certain illustrative examples, the resistance of a line can be graded by grading the composition of the line. Lines may be composed of a variety of conductive materials. Different materials may have slightly different conductive properties. Thus, one particular material may have a different resistance value than another conductive material. By grading the composition of the line from a higher conductive material to a lower conductive material (614) a line (610) with graded composition may be realized.

In some cases, a memory array may be built as a three dimensional memory array. This is done by stacking two-dimensional memory arrays on top of one another. The conductive lines that are connected between the different layers may also be graded. This will reduce the discrepancy between the voltage drop across memory elements in different layers.

Figure 7:
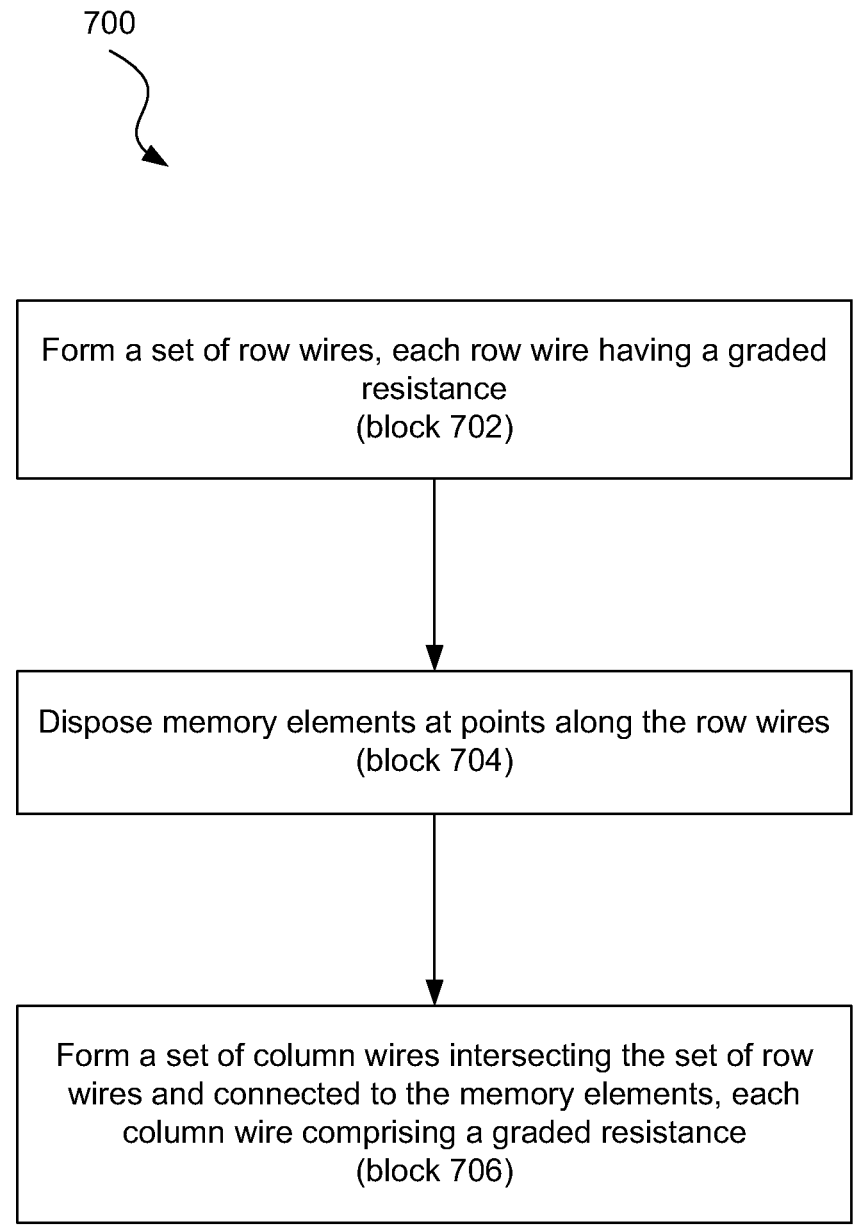
FIG. 7 is a flowchart showing an illustrative method for forming a memory array with graded resistance lines, according to one example of principles described herein.

FIG. 7 is a flowchart showing an illustrative method for forming a memory array with graded resistance lines. According to certain illustrative examples, the method includes forming (block 702) a set of row lines, each row line having a graded resistance, disposing memory elements at points along the row lines (block 704), and forming (block 706) a set of column lines intersecting the set of row lines and connected to the memory elements, each column line comprising a graded resistance.

In conclusion, by grading the resistance of the lines forming a crossbar memory array, the performance of that memory array is increased. This is because grading the resistance of the lines reduces the discrepancy in voltage applied to different memory elements within the memory array.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memory array with graded resistance lines comprising:
   a first set of lines intersecting a second set of lines;
   in which a line from one of said sets of lines comprises a graded resistance along a length of said line; and
   wherein said graded resistance comprises a resistance that decreases gradually along the length of said line in a direction away from where a voltage supply is to be connected to said line.

2. The array of claim 1, in which said graded resistance is formed by varying one of a thickness of said line and a width of said line.

3. The array of claim 1, further comprising, an additional line comprising a graded resistance along a length of said additional line, said graded resistance being opposite in direction to said graded resistance of said line.

4. The array of claim 1, in which said graded resistance is formed by varying a ratio between a first conductive material and a second conductive material, said second conductive material having less conductivity than said first conductive material.

5. The array of claim 1, further comprising memristive memory elements disposed at intersections between said first set of lines and said second set of lines.

6. The array of claim 5, in which said graded resistance of said line is greater at portions of said line closer to a voltage supply connected to said crossbar array.

7. The array of claim 1, comprising an additional layer of intersecting lines, in which lines connecting to said additional layer comprise a graded resistance.

8. The array of claim 1, in which said line comprises a cross-sectional area that varies along the length of said line to produce said graded resistance which gradually increases along the length of said line with an increase in the cross-sectional area.

9. The array of claim 1, wherein said line is connected to a voltage supply at a first end, and said graded resistance varies such that a resistance of said line decreases along a direction away from where the voltage supply is connected to said line.

10. The array of claim 1, wherein a plurality of said lines from said sets of lines comprises said graded resistance along a length thereof.

11. A crossbar memory device with graded resistance lines, the device comprising:
   a layer comprising a set of row lines intersecting a set of column lines, memory elements being disposed at intersections between said row lines and said column lines;
   in which said row lines and said column lines comprise a graded resistance; and
   wherein said graded resistance comprises a resistance that decreases gradually along a length of said lines in a direction away from where a voltage supply is connected to each said line.

12. The device of claim 11, in which said graded resistance is formed by varying one of a thickness and a width of one of said lines.

13. The device of claim 11, in which a direction of said graded resistance alternates between adjacent lines.

14. The device of claim 11, in which said graded resistance is formed by varying a ratio between a first conductive material and a second conductive material, said second conductive material having less conductivity than said first conductive material.

15. The device of claim 11, in which said memory elements comprise memristive memory elements.

16. The device of claim 11, comprising an additional layer of intersecting row lines and column lines.

17. The device of claim 16, in which lines between said layer and said additional layer comprise a graded resistance.

18. A method for forming a memory array with graded resistance lines, the method comprising:
   forming a set of row lines, each row line comprising a graded resistance;
   disposing memory elements at points along said row lines; and
   forming a set of column lines intersecting said set or row lines and connected to said memory elements, each column line comprising a graded resistance;
   in which said graded resistance is formed by varying a ratio between a first conductive material and a second conductive material, said second conductive material having less conductivity than said first conductive material.

* * * * *